United States Patent
Kuo

(10) Patent No.: US 7,710,702 B2
(45) Date of Patent: May 4, 2010

(54) PRIMARY SIDE CONTROL MODULE AND METHOD FOR PROTECTION OF MOSFET AGAINST BURNOUT

(75) Inventor: Jo-Chien Kuo, Taipei (TW)

(73) Assignee: Global Power Technologies, Inc., Pomona, CA (US)

( * ) Notice: Subject to any disclaimer, the term of this patent is extended or adjusted under 35 U.S.C. 154(b) by 534 days.

(21) Appl. No.: 11/803,754

(22) Filed: May 15, 2007

(65) Prior Publication Data

US 2007/0268641 A1  Nov. 22, 2007

Related U.S. Application Data

(60) Provisional application No. 60/801,931, filed on May 18, 2006.

(51) Int. Cl.
    *H02H 7/00*  (2006.01)
(52) U.S. Cl. .................... 361/93.1; 361/18
(58) Field of Classification Search ........ 361/93.1, 361/18
    See application file for complete search history.

(56) References Cited

U.S. PATENT DOCUMENTS

| | | | |
|---|---|---|---|
| 4,769,753 A | 9/1988 | Knudson et al. | |
| 4,890,210 A | 12/1989 | Myers | |
| 5,204,563 A | 4/1993 | Jason | |
| 5,621,627 A | 4/1997 | Krawchuk et al. | |
| 5,670,863 A * | 9/1997 | Broell et al. | 320/145 |
| 5,682,748 A * | 11/1997 | DeVilbiss et al. | 62/3.7 |
| 6,038,145 A | 3/2000 | Jacobs et al. | |
| 6,185,082 B1 | 2/2001 | Yang | |
| 6,445,141 B1 | 9/2002 | Kastner et al. | |
| 6,456,511 B1 | 9/2002 | Wong | |
| 6,471,659 B2 | 10/2002 | Eggers et al. | |
| 6,691,233 B1 * | 2/2004 | Gannage et al. | 713/300 |
| 6,740,079 B1 | 5/2004 | Eggers et al. | |
| 6,784,624 B2 | 8/2004 | Buonocunto | |
| 6,803,746 B2 | 10/2004 | Aker et al. | |
| 6,879,491 B2 | 4/2005 | Jauregui | |
| 6,923,804 B2 | 8/2005 | Eggers et al. | |
| 6,995,991 B1 | 2/2006 | Yang et al. | |
| 2002/0019596 A1 | 2/2002 | Eggers et al. | |
| 2002/0021560 A1 | 2/2002 | Jauregui | |
| 2002/0130645 A1 | 9/2002 | Tsai et al. | |
| 2003/0016505 A1 | 1/2003 | Jauregui | |
| 2003/0094931 A1 | 5/2003 | Renyolds | |
| 2003/0102845 A1 | 6/2003 | Aker et al. | |
| 2003/0128485 A1 | 7/2003 | Matsumoto | |
| 2003/0146714 A1 | 8/2003 | Buonocunto | |

(Continued)

*Primary Examiner*—Stephen W Jackson
(74) *Attorney, Agent, or Firm*—Elliott N. Kramsky

(57) ABSTRACT

A primary side control module for a switching power supply and a method for protecting a MOSFET that is controlled by a controller chip of the type that includes a timing network and switching drive output pins. The module includes the controller chip and the MOSFET. The controller chip provides a gating signal at the switching drive output pin to the MOSFET that may regulate the passage of current through the primary winding of a transformer of a switching power supply.

A circuit branch provides communication between the throughput of the MOSFET and the timing network pin of the controller chip. A capacitor is provided within the circuit branch to differentiate the throughput and provide a signal characterized by downgoing spikes that result in protection of the MOSFET from burnout due to abnormalities associated with the internal operation of the controller chip.

14 Claims, 4 Drawing Sheets

U.S. PATENT DOCUMENTS

2004/0030328 A1 2/2004 Eggers et al.
2005/0046387 A1 3/2005 Aker et al.
2005/0212501 A1 9/2005 Acatrinei
2006/0018135 A1 1/2006 Yang et al.

* cited by examiner

FIG. 4(f)

PRIMARY SIDE CONTROL MODULE AND METHOD FOR PROTECTION OF MOSFET AGAINST BURNOUT

REFERENCE TO RELATED APPLICATION

The present application claims the priority of provisional patent application Ser. No. 60/801,931 of inventor Jo-Chien Kuo titled "MCM Malfunction Prevention Circuit" filed May 18, 2006 in the United States Patent and Trademark Office.

BACKGROUND

1. Field of the Invention

The present invention relates to controllers for switching power supplies and to methods for protecting power switches thereof. More particularly, this invention pertains to a primary side control module for a switching power supply with pulse width modulation for controlling the switching of a power FET and to a method for protecting the FET against burnout.

2. Description of the Prior Art

If there is any one component that is absolutely vital to the operation of a computer, it is the regulated power supply. The supply converts the a.c. of a home or office line to the d.c. required to operate the computer and its components and peripherals.

Switched- or switch mode power supplies ("SPMS") are often employed rather than linear power supplies ("PSU") despite greater complexity when reduced size and greater operational efficiency are desired. In an SPMS, a switching regulator switches a load current off and on rapidly to stabilize the output voltage rather than the linear regulator of a PSU.

An SPMS operates by switching a power FET to regulate the current. The switched current passes through an inductor or the primary of a transformer. When the current flows through the inductor or primary, energy is stored for ultimate transfer as d.c. to the output when the current is switched off. This assures a steady d.c. output.

Standard integrated circuits or chips exist for controlling current switching of the power FET in an SPMS. One well recognized family of chips consists of the fixed frequency current mode pulse width controller having the designation UC 3842. Such chip is commercially available from numerous sources including, but not limited to, Fairchild Semiconductor Corporation of South Portland, Me. and Phillips Semiconductors of Eindhoven, The Netherlands.

Switching power supplies of the above-described type, in which a fixed frequency current mode pulse controller provides a signal that controls the "OFF" and "ON" cycling of a power MOSFET can experience a catastrophic failure mode and burnout due to failure of the switching mode. FIGS. 1(a) through 1(e) are a series of waveforms that illustrate the nature of the above-described failure mode.

It is known that a controller such as a UC 3842 generates a PWM waveform output through the interaction of a sawtooth waveform with a d.c. voltage level $V_{int}$, comprising the output of an error amplifier (internal to the controller). The waveform, comprising a series of voltage ramps, is generated in accordance with signals input to the controller from external circuitry. The interaction of a sawtooth waveform, shown in FIG. 1(a), with $V_{int}$ during "normal" conditions is illustrated by FIGS. 1(b) and 1(c).

Viewing FIGS. 1(b) and 1(c) together, one can see that the leading edge of an output pulse 10 is generated by the concurrence of the value of a voltage ramp 12 of the sawtooth waveform with the output of the internal error amplifier of the controller while the trailing edge of the pulse is concurrent with the resetting edge 14 of the voltage ramp. As long as $V_{int}$ remains within the bounds of the voltage ramp, a stream of PWM pulses will be generated within the controller and subsequently output to the gate of the power MOSFET of the power supply.

A problem occurs when the error amplifier output $V_{int}$ ranges below the bounds of the voltage ramp. (Note: Should $V_{int}$ go above the peak of the ramp, a critical condition does not occur. Rather, the power supply will cease to function as no signal will be received for gating the power MOSFET.) Such problem is illustrated in FIGS. 1(d) and 1(e). As shown in FIG. 1(d), a voltage drop 16 lowers the value of $V_{int}$ beneath the lower bound of the sawtooth waveform 18. This is reflected in the resultant waveform output from the controller as illustrated in FIG. 1(e). As can be seen, a first pulse 20 is formed as above. That is, the intersection of the ramp 12 with $V_{int}$ creates a the leading edge of the pulse 20 while the trailing edge of the pulse 20 occurs with the subsequent resetting of the voltage ramp. Thereafter, a leading edge 22 is formed by the intersection of the downgoing portion 16 of $V_{int}$ with the next voltage ramp 24. However, a trailing edge of the inchoate "pulse" is never formed since, as $V_{int}$ now lies below the lower bound of the sawtooth waveform 18, there no longer occurs a coincidence of the error amplifier output $V_{int}$ with a resetting edge of the voltage ramp 24 or, for that matter, with the resetting edge of any subsequent voltage ramp of the sawtooth waveform 18. Thus, rather than forming a second completed pulse, the output of the controller simply goes "HIGH", causing the voltage at the gate of the driven MOSFET to a continuous conduction mode that produces the failure mode discussed above.

SUMMARY OF THE INVENTION

The present invention addresses the preceding and other shortcomings of the prior art by providing, in a first aspect, a primary side control module for a switching power supply of the type in which the flow of an input current through a primary winding of a transformer is controlled by a switch. Such module includes a controller that is characterized by at least one port for receiving an input signal and at least one port for providing an output signal.

The output signal controls the switch and the input signal comprises the throughput of the switch. A capacitor is arranged to receive the throughput of the switch so that such input signal comprises the derivative of the throughput of the switch.

In a second aspect, the invention provides a method for protecting a switch against excessive current throughput in response to a gating signal provided at a switching drive output pin of a controller of the fixed frequency current mode pulse width type. Such method is begun by turning said switch "ON" in response to a leading edge of the gating signal and receiving the current throughput from the switch.

Thereafter, the current throughput is differentiated and applied to a timing network pin of the controller to generate a trailing edge of the gating signal. The trailing edge of the gating signal is applied to the switch to turn it "OFF". The method is then repeated until there exists no further current throughput.

In a third aspect, the invention provides a method for controlling a pulse width modulated signal provided at the switching drive pin of a controller of the fixed frequency current mode pulse width modulation type. Such method is begun by arranging an RC network for providing a first signal at a timing network pin of the controller.

A second signal is provided at the timing network pin of the controller that is characterized by a plurality of downwardly-directed spikes. Each of the downwardly-directed spikes is synchronized with a trailing edge of a pulse width modulated waveform output at the switching drive output pin of the controller.

The preceding and other features of the invention are described in a detailed description that follows. Such description is accompanied by a set of drawing figures. Numerals of the drawing figures, corresponding to those of the written description, point to the features of the invention. Like numerals refer to like features throughout both the written description and the drawings.

BRIEF DESCRIPTION OF THE DRAWINGS

FIGS. 4(a) through 4(g) are a set of waveforms for illustrating the solution to the failure mode addressed by the module of the present invention.

DETAILED DESCRIPTION OF THE PREFERRED EMBODIMENT

Figure 2:
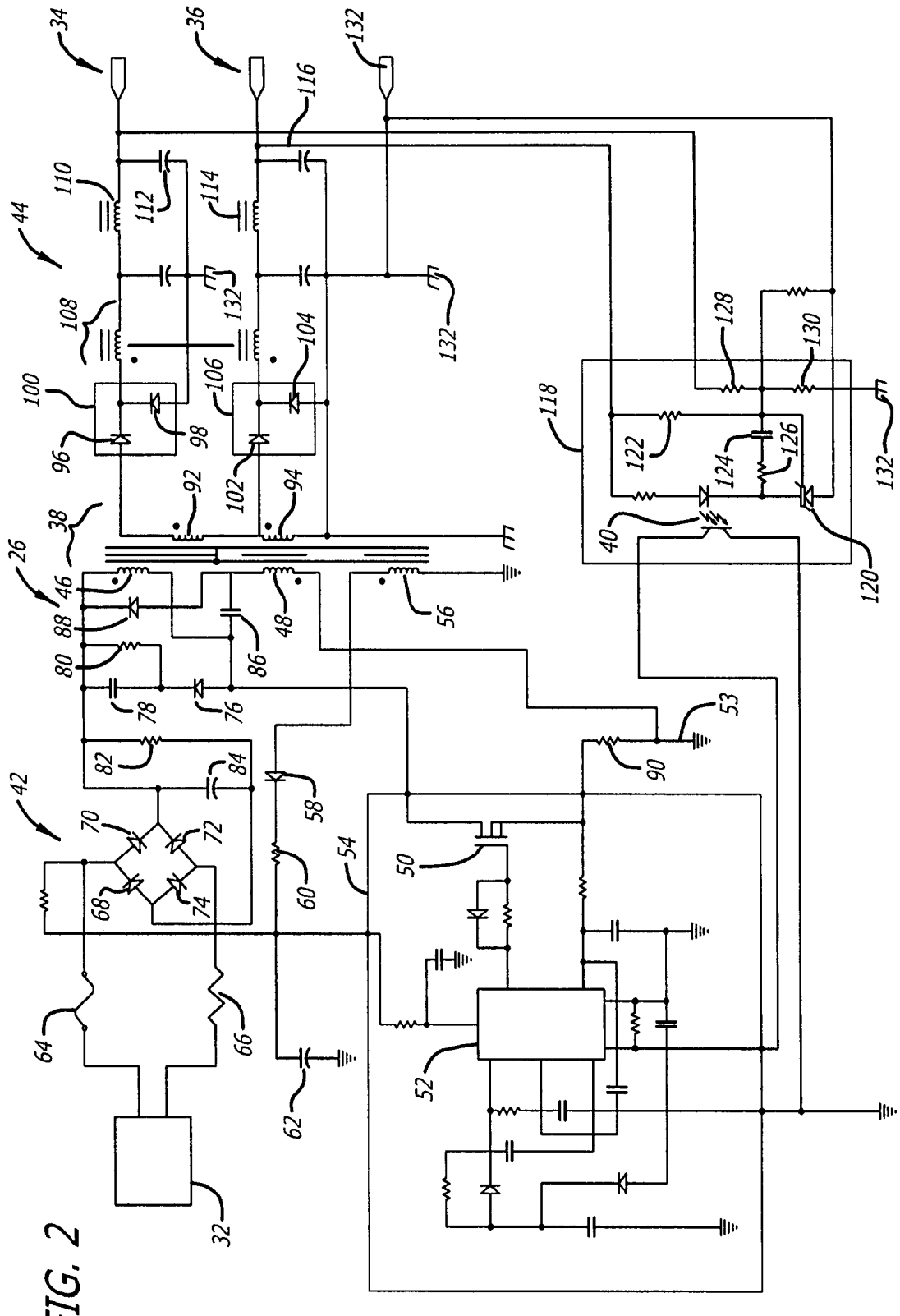
FIG. 2 is a schematic diagram of a switching power supply including a primary side control module in accordance with an embodiment of the invention.

FIG. 2 is a schematic diagram of a switching power supply 26 including a primary side control module 28 in accordance with the invention. The power supply 26 is arranged to convert a relatively high voltage (a.c. or d.c.) input 32 to a pair of d.c. outputs (12 volt and 5 volt) 34, 36 suitable for devices that would otherwise be harmed by direct application of the input 32.

A power transformer 38 and an optical coupler 40 provide isolation between the primary side 42 and the secondary side 44 of the power supply 26. The transformer 38 includes a primary winding 46 that is paired with a snubber winding 48 for canceling and reducing overshoot occasioned by the switching of a MOSFET 50 that is, in turn controlled, by a pulse width modulated signal emitted from a controller 52. That is, a gating signal, comprising the output of the controller 52, causes the MOSFET 50 to switch between an "OFF" state and an "ON" state, wherein a throughput of current is caused to flow from the input 32, through the winding 46 of the transformer and to a primary side ground 53. The controller 52, comprises a fixed frequency current mode pulse width modulation controller chip of the type that is commercially available under such designations, for example, as UC3842, UC 3843, UC3844 and UC3845 from, among many vendors, Phillips Semiconductors of Sunnyvale, Calif. and Fairchild Semiconductor of South Portland, Me. It will be seen to comprise the operational heart of a module 54 that provides the timing and modulation functions of the power supply 26.

Effective cycling of the MOSFET 50 is essential to the long-term reliability of the module 54 and, by extension, of the power supply 26 in which it functions. The present invention addresses a failure mode that has, in the past, compromised the power MOSFET commonly employed in switching power supplies. The inventor has found that a failure mode characterized by burnout of the MOSFET 50 and, consequently, of the power supply 26 results when the MOSFET 50 is maintained in a conductive state for excessive periods of time. The high internal impedance of the MOSFET 50 permits its power-handling capacity to be exceeded unless it can be reliably cycled throughout operation.

A secondary winding 56 of the transformer 38 provides current to a circuit that includes a diode 58, a current-limiting resistor 60 and a capacitor 62 for surge suppression. Such circuit will be seen to deliver a voltage $V_{cc}$ input to the controller 52. The remainder of the primary side 42 of the power supply 42 that exists outside the module 54, discussed in detail below, comprises a fuse 64 and a thermistor 66 for circuit protection, a rectifying bridge comprising diodes 68 through 74 arranged as shown, a snubber circuit that includes a diode 76, a capacitor 78 and a resistor 80. An RC circuit comprises a resistor 82 and a capacitor 84. A diode 88 rectifies the flow of current for trimming overshoot resulting from switching of the MOSFET 50 and a resistor 90 provides line sensing.

Turning to the secondary side 44, secondary windings 92 and 94 receive energy from the primary side of the transformer 38 for inducing current flows that result in the d.c. outputs 34 and 36 respectively, each of which has been processed through a rectifier and a two stage filter. Diodes 96 and 98 form a first secondary rectifier 100 of the circuit for converting the high frequency a.c. of the secondary winding 92 to d.c. while diodes 102 and 104 form a second secondary rectifier 106 for similarly converting the high frequency a.c. of the secondary winding 94 to d.c. The outputs of the rectifiers 100 and 106 thus comprise d.c. (The transformer 38 is of compact, high frequency design as a consequence of the high frequency of the MOSFET 50.)

Each of the d.c. signals emerging from the rectifiers 100 and 106 includes a ripple. The high frequency electromagnetic conduction current content of such signals is cancelled by means of common choke 108. Thereafter, the second filter stages, comprising a choke 110 and a capacitor 112 and a choke 114 and a capacitor 116 smooth the outputs of the common choke 108 of the first filter stage to provide the smoothed d.c. outputs 34 and 36 respectively.

The d.c. outputs of the power supply 26 are fed back to the primary side 42 by means of a feedback circuit 118 that includes the optical coupler 40. The circuit includes a Zener diode 120 for regulation of the output of the optical coupler 40. A resistor 122, capacitor 124 and resistor 126 provide bias current to the Zener diode 120, typically setting the diode 120 for regulation of ±5 percent of an output level. Resistors 128 and 130 form a voltage divider that conducts the output 34 to secondary ground 132 and setting the lower bound of the voltage drop across the optical coupler 40. The upper level of the drop reflects the value of the output 36. Accordingly, the value of the induced signal fed back to the primary side 42 of the power supply 26 by means of the optical coupler 40 is a reflection of the values of the two d.c. outputs 34 and 36.

Figure 3:
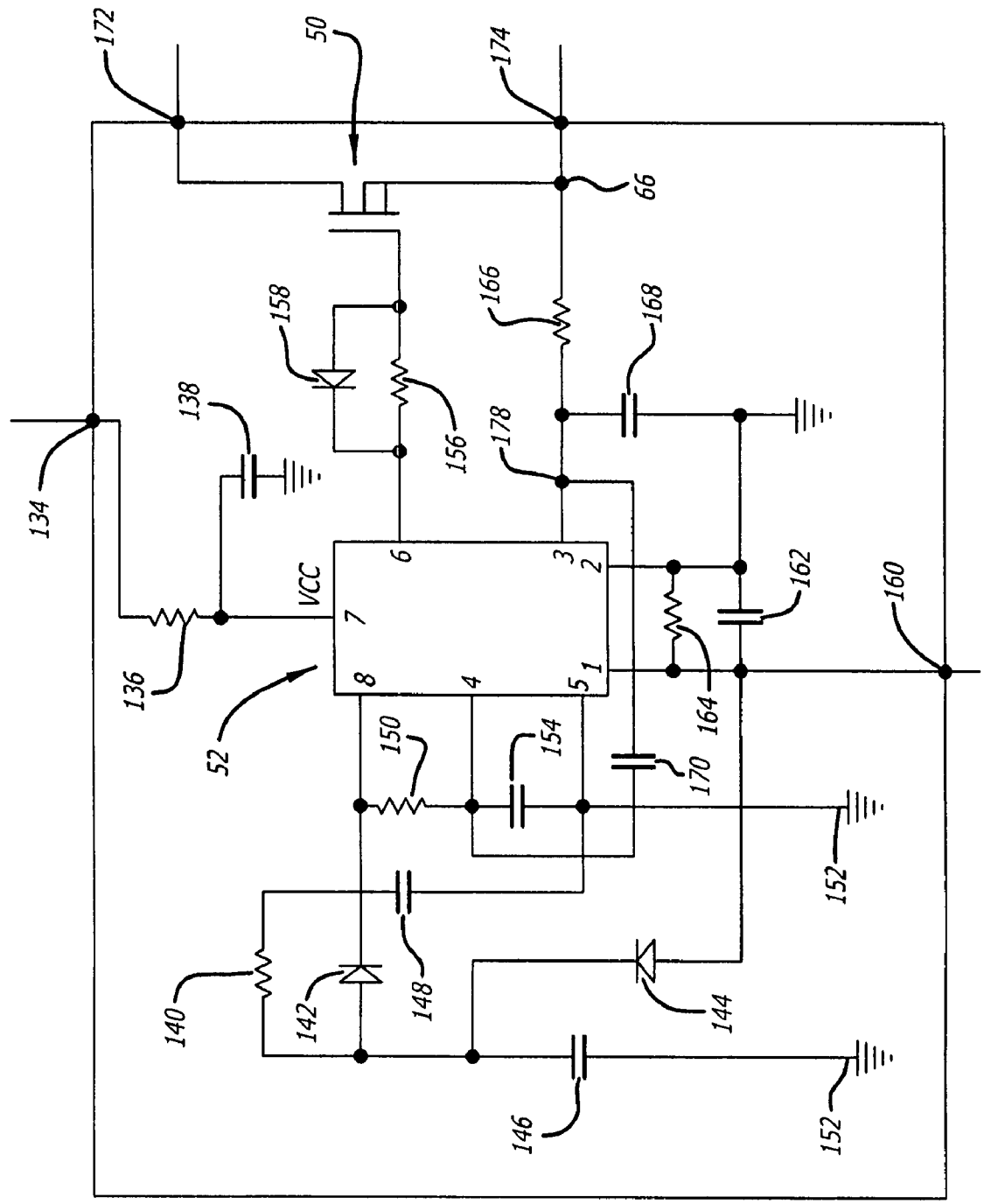
FIG. 3 is a schematic diagram of a primary side control module in accordance with the invention.

FIG. 3 is a schematic diagram for accompanying a detailed discussion of the primary side control module 54 that will be seen below to address the problem of MOSFET burnout of the prior art. The module 54 incorporates the functions of walk-in, shutdown, undervoltage lockout and malfunction prevention to thereby provide the requisite pulse width modulated switching of the MOSFET 50 for generating the d.c. outputs 34 and 36. The module 54 and its functions will be described below on the assumption that the controller 52 utilized therein is of the designation UC 3842A with references made to the pin configuration of such a chip. However, the invention is not limited to the use of such chip for controller of the module 52. Rather, one may readily relate the following discussion of the illustrated embodiment to other fixed frequency current mode pulse width modulation controller chips by observing, and translating pin 9 (alt., "port") designations of a UC 3842A chip to those of other applicable chips by observing (and appropriately translating) the mapping of functions to pin locations of a UC 3842A chip as referenced in the following table:

| Pin of UC 3842A | Function |
|---|---|
| 1 | Error amplifier output |
| 2 | Error amplifier inverting input |
| 3 | Current sense comparator |
| 4 | Timing network |
| 5 | Device ground |
| 6 | Switching drive output |
| 7 | Device supply voltage input |
| 8 | Voltage reference |

Additional operational details of the UC 3842A controller are disclosed, for example, in the publication of Lester J. Hadley, Jr., "UC3842 Application Note", *Phillips Semiconductors Application Note AN*1272, Revision 1 (April 1996). Such publication is hereby incorporated by reference.

Referring again to FIG. 3, a pin 134 of the module 54 receives current induced in the secondary winding 56 of the transformer 38. A current limiting resistor 136 and a bypass capacitor 138 are interposed between the module pin 134 and the power supply input pin 7 of the controller chip 52. Such input provides a starting current and supply voltage for the controller 52. Such starting current, when received at the pin 7 of the controller 52, causes it to activate an internal voltage reference of +5.0 volts at the controller pin 8. Such internal voltage reference only becomes active at startup when the supply voltage exceeds an undervoltage threshold of +16 volts.

The resistor 138 protects the controller 52 at startup by preventing the flow of surge current and high voltage. It also serves as a fuse to prevent an internal short circuit. The bypass capacitor 138 additionally provides noise suppression to reduce false undervoltage lockout.

A resistor 140 in combination with a diode 142, diode 144 and capacitors 146 and 148 form a walk-in circuit in communication with the pin 8 of the controller 52 for preventing damage as a result of oscillation and overshoot in load during start-up and shutdown of the controller 52.

Pin 4 of the controller 52, in external connection with pin 8 of the controller 52 through a resistor 150 and to the primary side ground 53 via a capacitor 154, form an RC network that provides an input to the for setting the period of the sawtooth waveform discussed above.

The switching drive output for delivering a maximum of 200 ma source and sink current to drive the power MOSFET 50 is provided at the pin 6 of the controller 52. An output signal from the pin 6 passes through a circuit arrangement comprising a resistor 156 that is scaled in combination with the input capacitance of the MOSFET 50 for optimum performance. A feedback diode 158 is arranged to speed discharge from the input capacitance of the MOSFET 50 to reduce switching losses and to increase efficiency.

Feedback from the secondary side 44 of the power supply 26, coupled from the secondary side 44 to the primary side 42 by the optical coupler 40 is received at pin 160 of the module 54. A capacitor 162 and a resistor 164 form a compensation network that is configured to communicate with the controller 54 at the pins 1 and 2 and acts as an operational amplifier in conjunction with the controller 52.

A resistor 166 and a capacitor 168 form an RC filter connected to pin 3 of the controller 52 for suppressing current spikes produced by rectifier recovery and/or by interwinding capacitance in the transformer 38. A capacitor 170 differentiates of the signal gated through the MOSFET 50 (after conditioning by the RC network of the resistor 166 and the capacitor 168) and is arranged to inject the differentiated signal at pin 4 of the controller 54. It will be seen below that such differentiated signal acts to modify the sawtooth waveform generated within the controller 52 to produce a resultant modified sawtooth waveform that overcomes abnormalities that have led to MOSFET burnout in the prior art.

The primary winding 46 of the transformer 38 is connected to the module 54 at a module pin 172. Within the module 54, the pin 172 is in electrical communication with the drain of the MOSFET 50. The drain of the MOSFET 50 is, in turn, connected to the primary side ground 152 through module pin 174 and the current sensing resistor 90 (see FIG. 2).

Figure 4A:
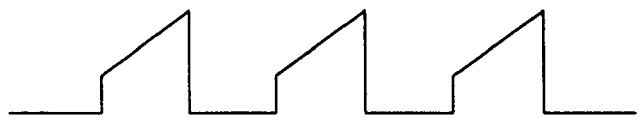

FIGS. 4(a) through 4(g) are a set of waveforms for illustrating the solution to the failure mode addressed by the module 54 of the present invention. The waveform of FIG. 4(a) represents the switched output from the primary winding 46 of the transformer 38 at a circuit node 176 of the module 54 (drain of the MOSFET 50). The RC filter comprising the resistor 166 and the capacitor 168 removes the overshoots from the waveform of FIG. 4(a) to provide the waveform of FIG. 4(b) at a circuit node 178.

Figure 4B:
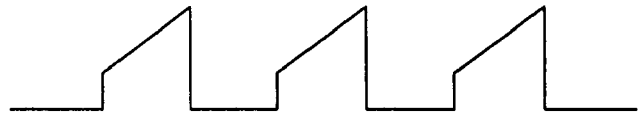
Figure 4C:
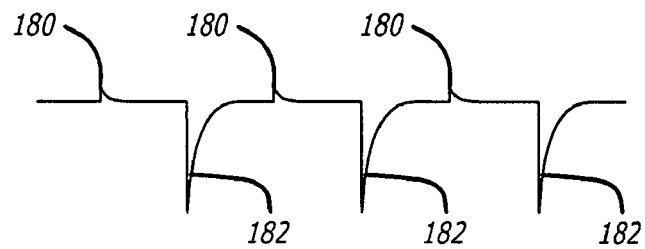

The capacitor 170, located within a circuit branch that spans the pins 3 and 4 of the controller 54, differentiates the waveform of FIG. 4(b), forming that illustrated in FIG. 4(c) as the signal present at the node 178 (switched output from the drain of the MOSFET 50) is transmitted to the pin 4 of the controller 14. Such waveform, representing the first derivative of the waveform of FIG. 4(b), is characterized by the alternation of relatively-small upgoing voltage spikes 180 with relatively-large downgoing spikes 182. This reflects the difference between the sizes of the positive-going, relatively-abrupt leading edge transitions and the negative-going trailing edge transitions of the waveform of FIG. 4(b).

Figure 1A:
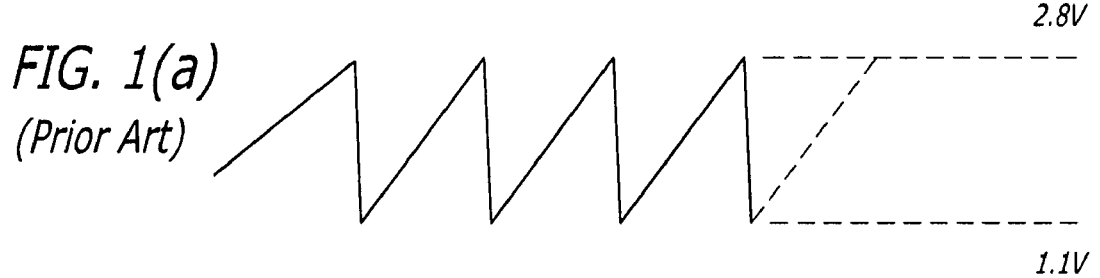
FIGS. 1(a) through 1(e) are a series of waveforms for illustrating the normal and abnormal operational modes of a controller for driving a power FET in accordance with the prior art.
Figure 1B:
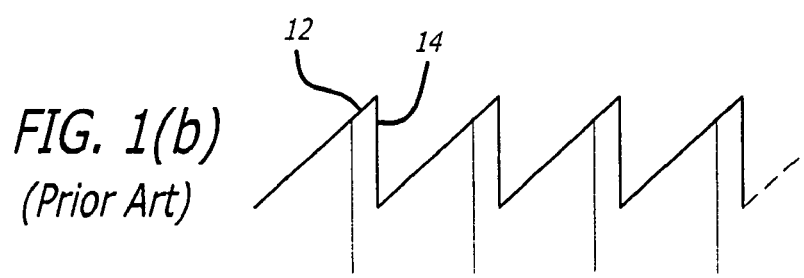
Figure 1C:
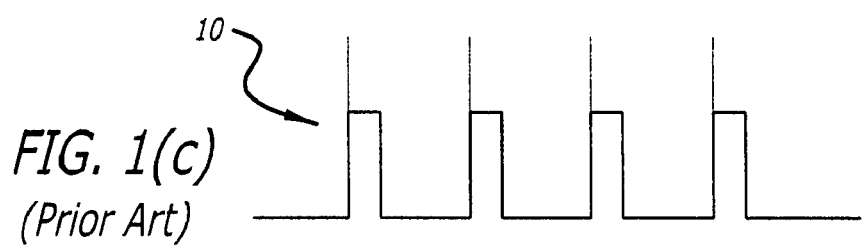
Figure 4D:
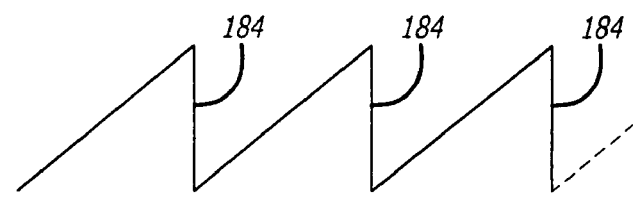

The sawtooth waveform of FIG. 4(d) corresponds to that illustrated in FIG. 1(a), it being noted that the resetting edges 184 of the voltage ramps of the sawtooth waveform coincide with the downgoing voltage spikes 182 of the waveform of FIG. 4(c). Such coincidence of waveforms reflects the fact that the waveform of FIG. 4(c) is derived from a signal switched through the MOSFET 50 that has been gated by a signal generated internally to the controller 52 that is output at the pin 6. As explained earlier the internally-generated pulse width modulated gating signal output at the pin 6 of the controller 52 relies upon the sawtooth waveform of FIG. 4(d), assuring the observed coincidence of its resetting edges 184 with the downgoing spikes 182 of the waveform of FIG. 4(c).

Figure 4E:
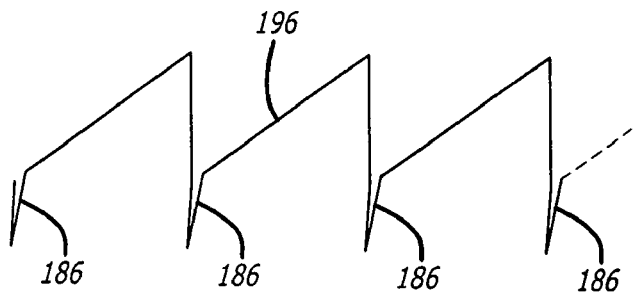

The waveform of FIG. 4(c), applied to the pin 4 of the controller 52, is superimposed upon the sawtooth waveform of FIG. 4(d) within the controller 52 to form the modified sawtooth waveform FIG. 4(e). The waveform of FIG. 4(e) includes downgoing spikes 186 at the trailing or resetting edges of the "original" voltage ramp of FIG. 4(d). Such spikes 186 reflect the injection of the waveform of FIG. 4(c) with the relatively-large downgoing voltage spikes 182 that coincide with the resetting edges 184 of the sawtooth waveform of FIG. 4(d).

Figure 1D:
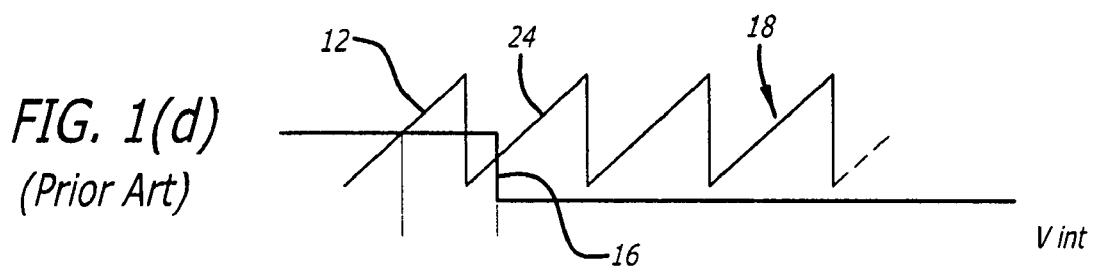
Figure 1E:
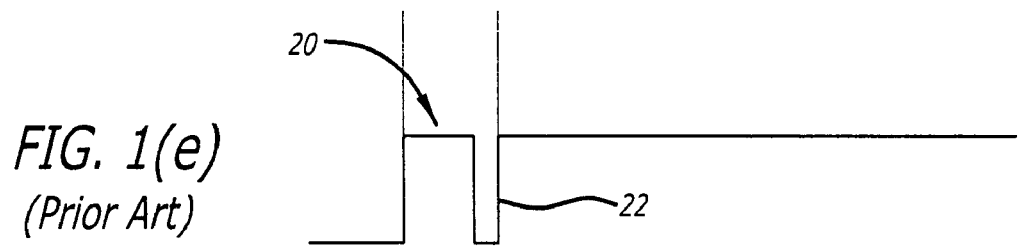

The downgoing spikes 186 effectively extend the range of the resetting edges 184 of the sawtooth waveform of FIG. 4(d). The effect of such modification of the voltage ramp can be seen in FIGS. 4(f) and 4(g). As in the prior art example illustrated in FIG. 1(d), a decrease in the error amplifier output $V_{int}$ of the controller 52 by a downward step 188 causes the value of $V_{int}$ to drop below the nominal "floor" of the sawtooth waveform of FIG. 4(d) (below 1.1. volts). However, unlike the prior art situation illustrated in FIGS. 1(d) and 1(e), this does not disable the ability of the controller 52 to continue to provide a pulse width modulated waveform at the pin 6 for gating the MOSFET 50.

Figure 4G:
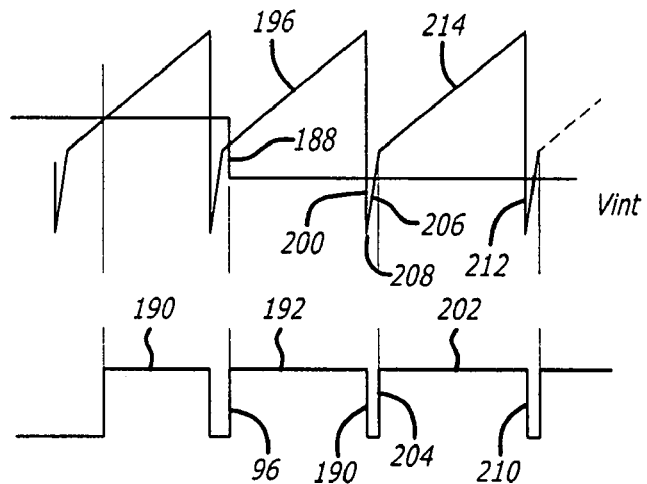

As can be seen from FIGS. 4(f) and 4(g), after a gating pulse 190 is formed prior to occurrence of an abnormality, a second pulse 192 is then formed. The leading edge 194 of such pulse is formed by the concurrence of the drop 188 in $V_{int}$ with the voltage ramp 196 of the modified sawtooth waveform of FIG. 4(d). Unlike the earlier-described situation of the prior art, a trailing edge 198 is formed to complete the second pulse 192 by the now-possible concurrence of the lowered value of $V_{int}$ with the extended downgoing portion 200 of the trailing edge of the voltage ramp 196 of the modified sawtooth waveform of FIG. 4(f). A third pulse 202 is then formed whose leading edge 204 is produced by concurrence of the upgoing portion 206 of the extended downgoing edge 208 with $V_{int}$ while its trailing edge 210 is formed by the concurrence of the abnormally-low value of $V_{int}$ with the downgoing portion 212 of the resetting edge of voltage ramp 214 of the modified sawtooth waveform. The process of producing a pulse width modulated gating signal that will not cause burnout of the MOSFET 50 can then continue in the presence of the noted abnormality unlike the situation of the prior art illustrated above.

Thus, it is seen that the present invention provides a switching module suitable for use in the primary circuitry of a forward switched power supply that permits the continuation of effective operation even in the presence of abnormal internal operation of a standard controller chip. The invention further provides a method for protecting the MOSFET switch of such a module from burnout occasioned by abnormal conditions within the controller of such a switching module. By utilizing the teachings of the present invention, one can realize greater reliability, longer useful operational life and greater safety than is presently available with controlled switching power supplies.

By providing a modular arrangement in which the control functions and MOSFET are integrated, for example, the module of the invention offers a small package that is ideal for use in switching power supplies of the type for application to desktop PC's, servers and the like.

A module in accordance with the invention can achieve a wide input voltage range, a high operating frequency (up to 100 kHz) in a small package. The input voltage for a module in accordance with the invention can be as high as 400 V dc and the switching frequency as high as 100 kHz.

While this invention has been described with reference to its presently preferred embodiment, it is not limited thereto. Rather, the invention is limited only insofar as it is defined by the following set of patent claims and includes within its scope all equivalents thereof.

What is claimed is:

1. A primary side control module for a switching power supply of the type in which the flow of an input current through a primary winding of a transformer is controlled by a switch, said module comprising, in combination:
    a) a controller;
    b) said controller being characterized by at least one port for receiving an input signal and at least one port for providing an output signal wherein said output signal controls said switch and said input signal comprises the throughput of said switch; and
    c) a capacitor arranged within a circuit branch connecting said throughput of said switch to said port for receiving an input signal whereby said input signal comprises the derivative of said throughput of said switch.

2. A primary side control module as defined in claim 1 wherein said switch comprises a MOSFET.

3. A primary side control module as defined in claim 2 wherein said controller is of the fixed frequency current mode pulse width modulation type.

4. A primary side control module as defined in claim 3 further characterized in that:
    a) said port for receiving an input signal comprises a timing network pin of said controller; and
    b) said port for providing an output signal comprises a switching drive output pin of said controller.

5. A primary side control module as defined in claim 4 wherein said controller is selected from the group of that includes the UC 3842, UC 3843, UC 3844 and UC 3855 families of controllers.

6. A method for protecting a switch against excessive current throughput in response to a gating signal provided at a switching drive output pin of a controller of the fixed frequency current mode pulse width type comprising the steps of:
    a) turning said switch "ON" in response to a leading edge of said gating signal; and
    b) receiving said current throughput from said switch; then
    c) differentiating said current throughput; and
    d) applying said differentiated current throughput to a timing network pin of said controller to thereby generate a trailing edge of said gating signal; and
    e) applying said trailing edge of said gating signal to said switch to turn "OFF" said switch; and then
    f) repeating steps a through e until there exists no further current throughput.

7. A method as defined in claim 6 wherein said switch is a MOSFET.

8. A method as defined in claim 7 wherein the step of differentiating said current throughput further includes the steps of:
    a) providing a circuit path connecting said drain of said MOSFET to said timing network pin of said controller; and
    b) providing a capacitor for differentiating said current throughput within said circuit path.

9. A method as defined in claim 8 wherein said controller is selected from the group of that includes the UC 3842, UC 3843, UC 3844 and UC 3845 families of controllers.

10. A method for controlling a pulse width modulated signal provided at a switching drive output pin of a controller of the fixed frequency current mode pulse width modulation type comprising the steps of:
    a) arranging an RC network for providing a first signal at a timing network pin of said controller; and
    b) providing a second signal at said timing network pin of said controller wherein said second signal is characterized by a plurality of downwardly-directed spikes, each of said downwardly-directed spikes being synchronized with a trailing edge of a pulse width modulated waveform output at said switching drive output pin of said controller.

11. A method as defined in claim 10 wherein said second signal is derived by the steps of:
    a) applying said pulse width modulated signal to a switch to gate a third signal that includes a leading edge and a trailing edge through a switch; and then b) differentiating said third signal whereby said downwardly-directed spikes comprise the differentials of said trailing edges of said third signal.

12. A method as defined in claim 11 wherein said step of differentiating said third signal comprises the step of arranging a capacitor in a circuit branch joining the output of said switch to said timing network pin of said controller.

13. A method as defined in claim 12 wherein said switch is a MOSFET.

14. A method as defined in claim 12 wherein said controller is selected from the group of that includes the UC 3842, UC 3843, UC 3844 and UC 3845 families of controllers.

* * * * *